(12) United States Patent
Truong

(10) Patent No.: US 10,135,333 B1
(45) Date of Patent: Nov. 20, 2018

(54) ENHANCED CONDUCTION FOR P-CHANNEL DEVICE

(71) Applicant: Silego Technology, Inc., Santa Clara, CA (US)

(72) Inventor: Tom Truong, San Francisco, CA (US)

(73) Assignee: Silego Technology, Inc., Santa Clara, CA (US)

( * ) Notice: Subject to any disclaimer, the term of this patent is extended or adjusted under 35 U.S.C. 154(b) by 87 days.

(21) Appl. No.: 14/507,733

(22) Filed: Oct. 6, 2014

Related U.S. Application Data

(60) Provisional application No. 61/887,298, filed on Oct. 4, 2013.

(51) Int. Cl.
| | |
|---|---|
| *G05F 1/10* | (2006.01) |
| *H02M 3/07* | (2006.01) |
| *H01L 27/088* | (2006.01) |

(52) U.S. Cl.
CPC .......... *H02M 3/07* (2013.01); *H01L 27/088* (2013.01); *H02M 2003/071* (2013.01)

(58) Field of Classification Search
CPC ......... H02M 3/07; H02M 3/073; G11C 16/30; G11C 16/10; G11C 16/0483
See application file for complete search history.

(56) References Cited

U.S. PATENT DOCUMENTS

| | | | | |
|---|---|---|---|---|
| 5,438,542 | A * | 8/1995 | Atsumi .................. | G11C 16/08 257/314 |
| 6,169,445 | B1 * | 1/2001 | Tanase ................... | H04B 10/50 327/108 |
| 2005/0194911 | A1 * | 9/2005 | Moon ...................... | G09G 3/22 315/167 |
| 2008/0068771 | A1 * | 3/2008 | Heath ..................... | H04L 12/10 361/93.1 |
| 2011/0163796 | A1 * | 7/2011 | Floyd .................... | H03K 17/166 327/536 |
| 2012/0188221 | A1 * | 7/2012 | Izawa .................... | G09G 3/325 345/212 |
| 2012/0327129 | A1 * | 12/2012 | Li ........................... | G09G 3/32 345/690 |
| 2013/0147697 | A1 * | 6/2013 | Sung ................. | G02F 1/136204 345/87 |
| 2013/0272547 | A1 * | 10/2013 | Waller, Jr. ............. | H03F 1/0233 381/120 |
| 2015/0070085 | A1 * | 3/2015 | Tyrrell ..................... | G05F 3/16 327/539 |

\* cited by examiner

*Primary Examiner* — Sibin Chen
(74) *Attorney, Agent, or Firm* — Van Pelt, Yi & James LLP

(57) ABSTRACT

A technique for enhancing the conduction of a p-channel device is disclosed. Specifically, a negative charge pump is configured to provide a gate drive voltage to a p-channel device. The negative charge pump creates a negative voltage potential below ground and facilitates increased gate drive for the p-channel device. The gate drive voltage output by the negative charge pump may be selected such that it is optimal for the p-channel device operation.

27 Claims, 3 Drawing Sheets

ENHANCED CONDUCTION FOR P-CHANNEL DEVICE

CROSS REFERENCE TO OTHER APPLICATIONS

This application claims priority to U.S. Provisional Patent Application No. 61/887,298 entitled ENHANCED CONDUCTION FOR P-CHANNEL LOAD SWITCH filed Oct. 4, 2013 which is incorporated herein by reference for all purposes.

BACKGROUND OF THE INVENTION

The on resistance ($R_{DSON}$) of a p-channel device is inversely proportional to gate drive voltage. FIG. 1 is a graph illustrating this inverse relationship. Thus, p-channel devices have high $R_{DSON}$ when operating in low voltage conditions in which gate voltage is not fully driven. Higher $R_{DSON}$ creates higher power dissipation, which is undesirable.

Due to conflicting trade-offs, it is difficult to select an appropriate p-channel device for a system. Selecting a high voltage p-channel device for low voltage operation where gate drive is not optimal results in high $R_{DSON}$. Selecting a low voltage p-channel device can improve the $R_{DSON}$ but results in higher channel and junction leakage. Junction voltage breaks during high voltage operation if the voltage rating of the p-channel is exceeded. Thus, selecting a low voltage p-channel device significantly limits range of operation. Selecting a p-channel device with a larger p-channel area may achieve a desired $R_{DSON}$ but at the expense of a larger footprint.

A p-channel device is typically best suited for a system in which the supply voltage range can be restricted. In such cases, an optimal p-channel operation voltage can be selected for that supply voltage range. It would be useful for p-channel devices to be suitable for a wider class of systems.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

A technique for enhancing the conduction (or, equivalently, reducing the $R_{DSON}$) of a p-channel is disclosed. The conduction of a p-channel is proportional to the gate drive voltage. The disclosed technique comprises using a negative charge pump to maintain an optimal gate drive voltage for a p-channel device. A negative charge pump creates a negative voltage potential below ground and facilitates increased gate drive for a p-channel device. As used herein, a p-channel device may comprise any PMOS (p-channel metal-oxide-semiconductor field-effect transistor) device. For example, a PMOS device may comprise a switch, a load switch, a power FET, etc.

Figure 1:
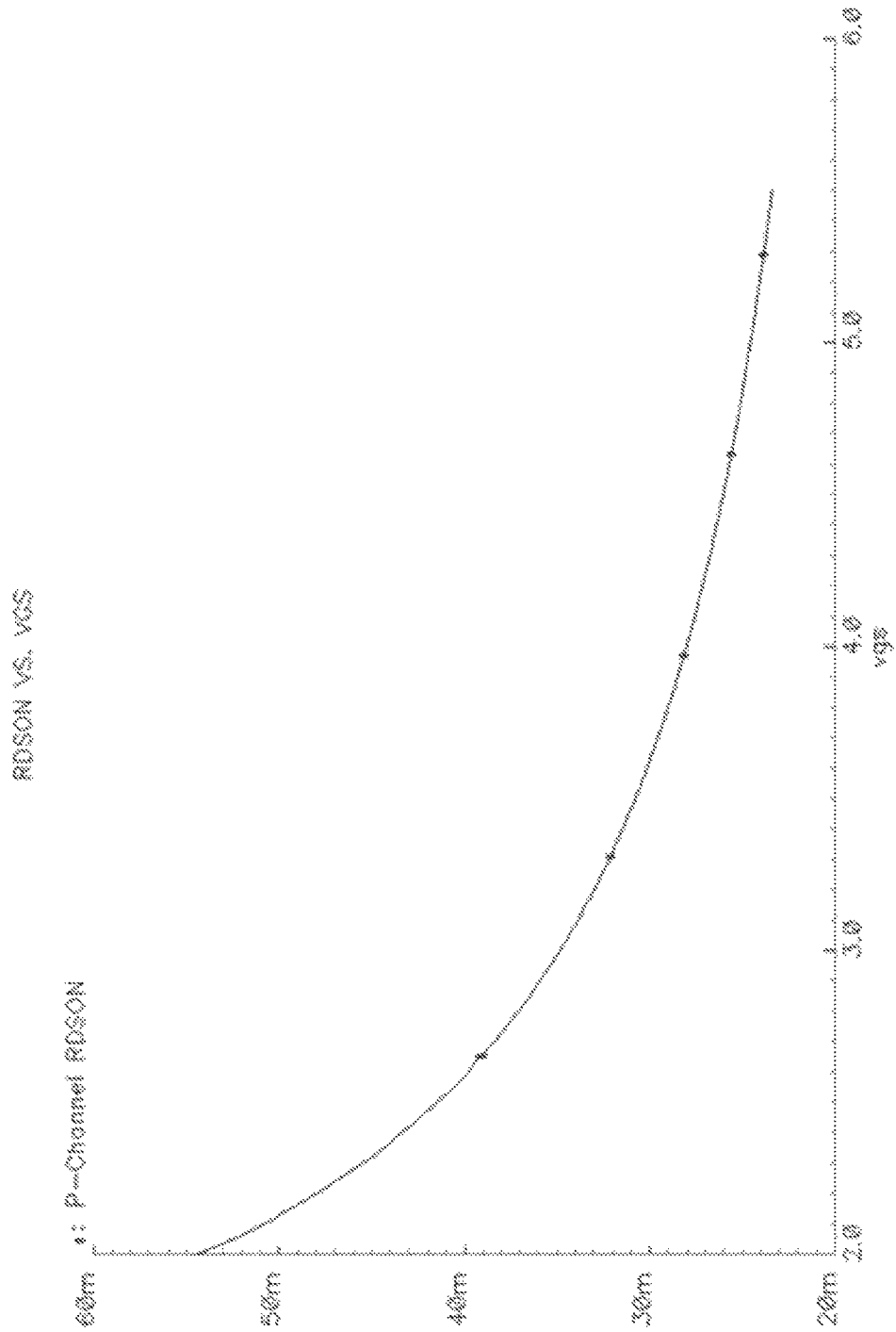
FIG. 1 is a graph of $R_{DSON}$ vs. $V_{GS}$ for a p-channel device.
Figure 2:
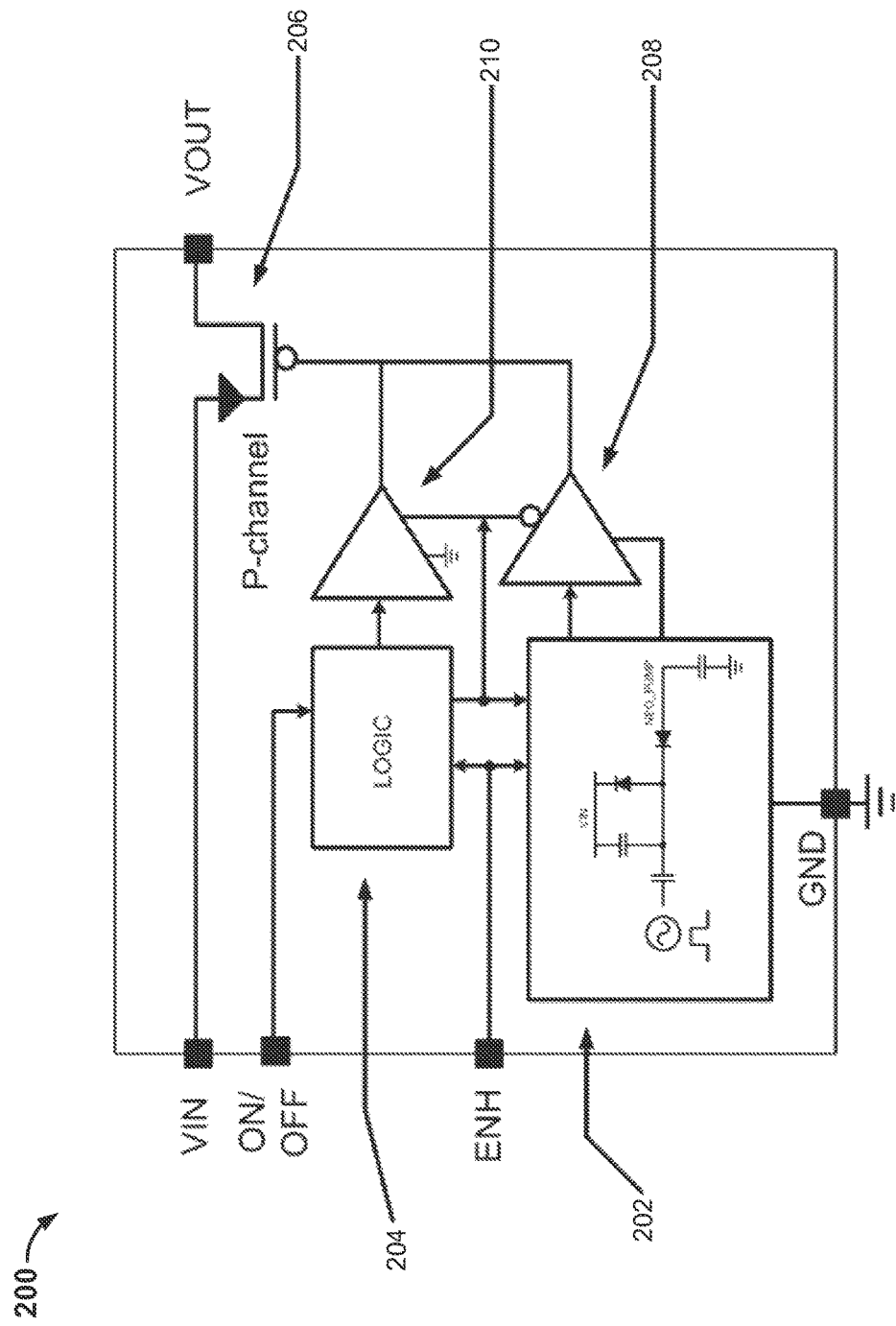
FIG. 2 illustrates an example application of using a negative charge pump to drive the gate voltage of a p-channel device.

FIG. 2 illustrates an example application of using a negative charge pump to drive the gate voltage of a p-channel device. Circuit 200 comprises one application of using a negative charge pump to facilitate gate drive of a p-channel device. A negative charge pump may be similarly employed to facilitate gate drive for a p-channel device in any other appropriate circuit and/or integrated circuit configurations in other embodiments. The main components of circuit 200 are further described in detail below.

Figure 3:
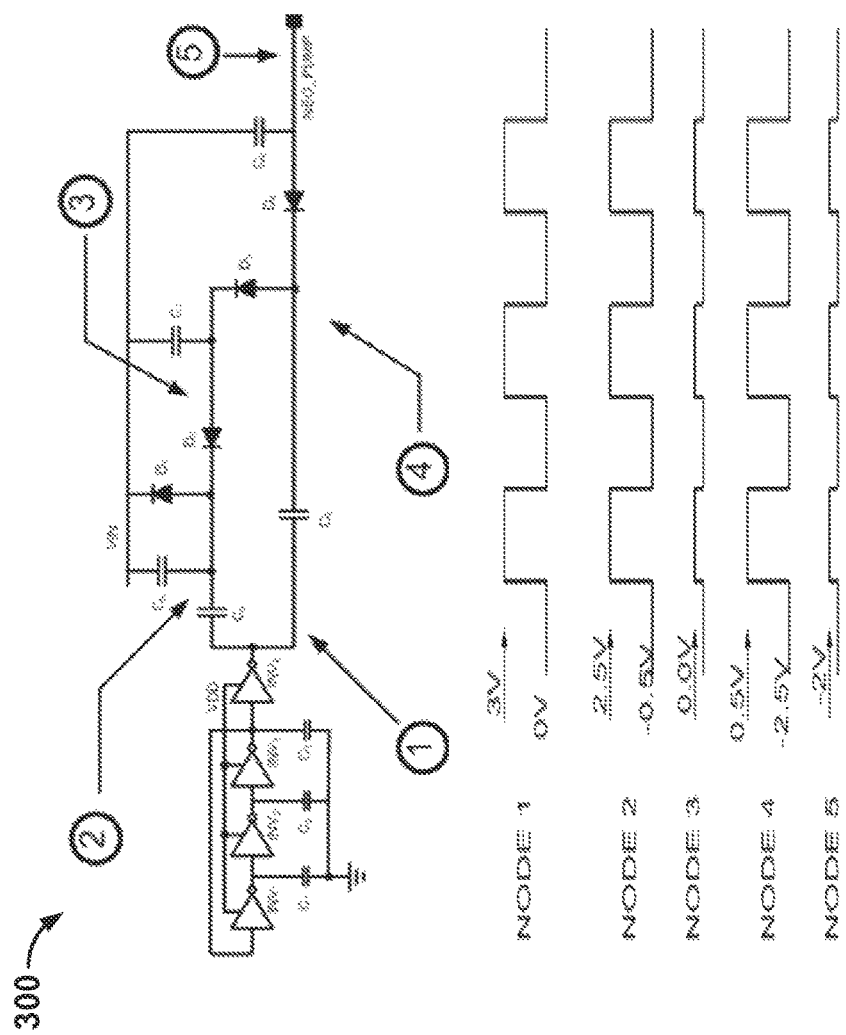
FIG. 3 illustrates an embodiment of a charge pump circuit.

As depicted, circuit 200 comprises a negative charge pump 202 that delivers a voltage potential to drive a p-channel device 206. Negative charge pump 202 may be configured to supply a voltage up to the maximum $V_{GS}$ of p-channel device 206 below input voltage supply $V_{IN}$. For example, if the maximum $V_{GS}$ of p-channel device 206 is 5V, the voltage from negative charge pump 202 is 5V below $V_{IN}$. Consider a $V_{IN}$<5V. For instance, if $V_{IN}$=1 V, negative charge pump 202 delivers-4 V. FIG. 3 illustrates example circuitry of a negative charge pump and is described in further detail below. As described with respect to the given example, a negative charge pump allows the use of a lower input voltage $V_{IN}$ since the requisite p-channel gate drive is supplied by the negative charge pump via a negative voltage below ground.

Logic block 204 of circuit 200 implements functionalities associated with the ON/OFF pin and ENH pin of the circuit. In the given example, the ON/OFF pin controls the turn-on and turn-off of p-channel device 206, and the ENH pin controls the gate voltage of p-channel device 206 while in the "ON" state. When ENH is set, the gate pulls to the charge pump voltage level, resulting in higher gate drive and reduced $R_{DSON}$. When ENH is not set, the gate is pulled to ground, resulting in a higher $R_{DSON}$. Thus, two modes of gate drive are provided and may be accordingly selected based on the application.

P-channel device 206 of circuit 200 comprises a switch for passing power to an associated system when the gate of the device is pulled to the charge pump voltage or to ground. Power is passed out of the circuit via the $V_{OUT}$ pin.

Gate driver 208 of circuit 200 pulls the gate of p-channel device 206 to the charge pump voltage when ENH is set. Quiescent current is required to keep the charge pump running Similarly, gate driver 210 of circuit 200 pulls the gate of p-channel device 206 to ground when ENH is not set. In this mode, the average quiescent current is zero.

FIG. 3 illustrates an embodiment of a charge pump circuit. For example, circuit 300 may comprise negative charge pump 202 of FIG. 2. In the given example, inverters $INV_1$, $INV_2$, and $INV_3$ comprise a three-stage ring oscillator, and inverter $INV_4$ comprises a buffer to drive the charge pump. Capacitors $C_1$, $C_2$, and $C_3$ the frequency of the ring oscillator.

The waveforms below circuit diagram 300 illustrate example signals at the marked nodes of circuit 300. Each of diodes $D_1$, $D_2$, $D_3$, and $D_4$ is assumed to have a 0.5V drop. A more detailed description of the signals at the marked nodes follows.

Node 1 corresponds to the oscillator output in the form of a square wave.

Node 2 corresponds to the signal of the oscillator boosted by capacitor $C_4$. The maximum voltage level is $V_{IN}$ clamped by $D_1$.

Node 3 represents diode $D_2$ blocking current from passing into node 2. When the node 2 voltage is lower, $D_2$ is forward biased, and current flows from node 3 to node 2. Capacitor $C_7$ stores charge between node 3 and $V_{IN}$.

Node 4 corresponds to the signal of node 1 boosted by capacitor $C_5$. When node 4 is high, it is clamped to node 3 by diode $D_3$. When node 1 goes low, capacitor $C_5$ pulls node 4 down.

Node 5 corresponds to the last stage of charge pump 300. Charge pump 300 of the given example can pump down to: $V_{IN} - 2V_{DD} + 4 V_d$ where $V_d$ is the diode voltage drop.

In the waveform example of FIG. 3, $V_{IN}$ is set to 2V, and $V_{DD}$ is set to 3V. Thus, the final voltage is pumped down to $-2V$. Relative to $V_{IN}$, the potential difference is $-4V$. More stages can be added to go down to the level where the gate drive for an associated P-channel device is optimal.

As described, an optimal gate drive level for a p-channel device can be achieved via a negative charge pump. Using a negative charge pump with a p-channel device offers many advantages including not limiting the voltage range of the p-channel device and maintaining low $R_{DSON}$ of the p-channel for a wide operating voltage range. Moreover, larger sized p-channel devices are not needed to achieve a prescribed $R_{DSON}$. Rather, devices having relatively smaller sized p-channels may be employed for the same $R_{DSON}$ by using the negative charge pump to keep the gate drive at an optimal level. Furthermore, the negative charge pump configuration allows a p-channel device having a higher threshold voltage to be used so that junction and channel leakage can be avoided.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A circuit, comprising:
    a p-channel device configured as a switch and having a gate drive voltage while in an on switch state;
    a first gate driver that drives the gate voltage of the p-channel device to a negative voltage output by a negative charge pump when an input pin of the circuit comprises a first state while in the on switch state, wherein the first state of the input pin while in the on switch state enables the negative charge pump; and
    a second gate driver that drives the gate voltage of the p-channel device to ground when the input pin of the circuit comprises a second state while in the on switch state, wherein the second state of the input pin while in the on switch state disables the negative charge pump;
    wherein when enabled the negative charge pump runs from quiescent current and when disabled average quiescent current is zero, wherein the circuit comprises an integrated circuit, wherein the input pin of the integrated circuit receives a signal for enabling and disabling the negative charge pump, and wherein the on switch state is determined by a signal received on a second input pin of the integrated circuit.

2. The circuit of claim 1, wherein the negative voltage output by the negative charge pump comprises a maximum gate-to-source voltage ($V_{GS}$) of the p-channel device below input supply voltage ($V_{IN}$).

3. The circuit of claim 1, wherein the gate drive voltage comprises an optimal gate drive level for the p-channel device.

4. The circuit of claim 1, wherein the gate drive voltage achieves a prescribed conduction of the p-channel device.

5. The circuit of claim 1, wherein operation of the p-channel device is not limited to a prescribed voltage range.

6. The circuit of claim 1, wherein the p-channel device comprises a PMOS (p-channel metal-oxide-semiconductor field-effect transistor) device.

7. The circuit of claim 1, wherein the p-channel device comprises a power MOSFET (metal-oxide-semiconductor field-effect transistor).

8. The circuit of claim 1, wherein the switch comprises a load switch.

9. The circuit of claim 1, wherein the negative charge pump comprises a ring oscillator.

10. A method, comprising:
    driving a p-channel device configured as a switch and having a gate drive voltage while in an on switch state using a first gate driver that drives the gate voltage of the p-channel device to a negative voltage output by a negative charge pump when an input pin of an associated circuit comprises a first state while in the on switch state, wherein the first state of the input pin while in the on switch state enables the negative charge pump; and
    driving the p-channel device using a second gate driver that drives the gate voltage of the p-channel device to ground when the input pin of the circuit comprises a second state while in the on switch state, wherein the second state of the input pin while in the on switch state disables the negative charge pump;
    wherein when enabled the negative charge pump runs from quiescent current and when disabled average quiescent current is zero, wherein the circuit comprises an integrated circuit, wherein the input pin of the integrated circuit receives a signal for enabling and disabling the negative charge pump, and wherein the on switch state is determined by a signal received on a second input pin of the integrated circuit.

11. The method of claim 10, wherein the negative charge pump comprises a ring oscillator.

12. The method of claim 10, wherein the negative voltage output by the negative charge pump comprises a maximum gate-to-source voltage ($V_{GS}$) of the p-channel device below input supply voltage ($V_{IN}$).

13. The method of claim 10, wherein the gate drive voltage comprises an optimal gate drive level for the p-channel device.

14. The method of claim 10, wherein the gate drive voltage achieves a prescribed conduction of the p-channel device.

15. The method of claim 10, wherein operation of the p-channel device is not limited to a prescribed voltage range.

16. The method of claim 10, wherein the p-channel device comprises a PMOS (p-channel metal-oxide-semiconductor field-effect transistor) device.

17. The method of claim 10, wherein the p-channel device comprises a power MOSFET (metal-oxide-semiconductor field-effect transistor).

18. The method of claim 10, wherein the switch comprises a load switch.

19. A non-transitory computer readable storage medium having computer-readable program instructions for:

driving a p-channel device configured as a switch and having a gate drive voltage while in an on switch state using a first gate driver that drives the gate voltage of the p-channel device to a negative voltage output by a negative charge pump when an input pin of an associated circuit comprises a first state while in the on switch state, wherein the first state of the input pin while in the on switch state enables the negative charge pump; and driving the p-channel device using a second gate driver that drives the gate voltage of the p-channel device to ground when the input pin of the circuit comprises a second state while in the on switch state, wherein the second state of the input pin while in the on switch state disables the negative charge pump;

wherein when enabled the negative charge pump runs from quiescent current and when disabled average quiescent current is zero, wherein the circuit comprises an integrated circuit, wherein the input pin of the integrated circuit receives a signal for enabling and disabling the negative charge pump, and wherein the on switch state is determined by a signal received on a second input pin of the integrated circuit.

20. The computer readable storage medium of claim 19, wherein the negative voltage output by the negative charge pump comprises a maximum gate-to-source voltage ($V_{GS}$) of the p-channel device below input supply voltage ($V_{IN}$).

21. The computer readable storage medium of claim 19, wherein the gate drive voltage comprises an optimal gate drive level for the p-channel device.

22. The computer readable storage medium of claim 19, wherein the gate drive voltage achieves a prescribed conduction of the p-channel device.

23. The computer readable storage medium of claim 19, wherein operation of the p-channel device is not limited to a prescribed voltage range.

24. The computer readable storage medium of claim 19, wherein the p-channel device comprises a PMOS (p-channel metal-oxide-semiconductor field-effect transistor) device.

25. The computer readable storage medium of claim 19, wherein the p-channel device comprises a power MOSFET (metal-oxide-semiconductor field-effect transistor).

26. The computer readable storage medium of claim 19, wherein the switch comprises a load switch.

27. The computer readable storage medium of claim 19, wherein the negative charge pump comprises a ring oscillator.

* * * * *